(12) United States Patent
Koike et al.

(10) Patent No.: US 10,978,627 B2
(45) Date of Patent: Apr. 13, 2021

(54) LIGHT-EMITTING ELEMENT AND LIGHT-EMITTING DEVICE

(71) Applicant: STANLEY ELECTRIC CO., LTD., Tokyo (JP)

(72) Inventors: Kyotaro Koike, Tokyo (JP); Noriko Nihei, Tokyo (JP); Shunya Ide, Tokyo (JP); Ji-Hao Liang, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 6 days.

(21) Appl. No.: 16/389,455

(22) Filed: Apr. 19, 2019

(65) Prior Publication Data

US 2019/0326491 A1   Oct. 24, 2019

(30) Foreign Application Priority Data

Apr. 20, 2018  (JP) .............................. JP2018-081721

(51) Int. Cl.
| | |
|---|---|
| *H01L 33/60* | (2010.01) |
| *H01L 33/50* | (2010.01) |
| *H01L 33/52* | (2010.01) |
| *H01L 25/075* | (2006.01) |
| *H01L 33/22* | (2010.01) |

(52) U.S. Cl.
CPC .......... *H01L 33/60* (2013.01); *H01L 25/0753* (2013.01); *H01L 33/22* (2013.01); *H01L 33/505* (2013.01); *H01L 33/52* (2013.01); *H01L 33/502* (2013.01); *H01L 2933/0091* (2013.01)

(58) Field of Classification Search
CPC ....... H01L 33/005; H01L 33/22; H01L 33/44; H01L 33/486; H01L 33/50; H01L 33/502; H01L 33/505; H01L 33/52; H01L 33/54; H01L 33/58; H01L 33/60
See application file for complete search history.

(56) References Cited

U.S. PATENT DOCUMENTS

| | | | | |
|---|---|---|---|---|
| 2011/0254036 A1* | 10/2011 | Kim | ................... | H01L 33/20 |
| | | | | 257/98 |
| 2015/0076505 A1* | 3/2015 | Ke | ................... | H01L 33/22 |
| | | | | 257/76 |
| 2016/0343908 A1* | 11/2016 | Aldaz | ................... | H01L 33/22 |
| 2017/0062671 A1* | 3/2017 | Hashimoto | ................... | H01L 33/005 |
| 2018/0240950 A1* | 8/2018 | Jang | ................... | H01L 33/20 |

FOREIGN PATENT DOCUMENTS

JP      2004080050 A     3/2004

\* cited by examiner

*Primary Examiner* — Joseph M Galvin, III
(74) *Attorney, Agent, or Firm* — Holtz, Holtz & Volek PC

(57) ABSTRACT

A light-emitting element and a light-emitting device having low light loss, high luminance, and high light extraction efficiency are provided. The light-emitting element includes: a semiconductor structure layer having a light-emitting layer; a light-transmitting substrate provided on the semiconductor structure layer; a wavelength conversion layer disposed on the light-transmitting substrate; a light-transmitting covering member configured to cover at least a part of a side surface of the light-transmitting substrate and have transparency to light from the light-emitting layer; and a light-shielding member configured to entirely cover surfaces including a surface of the light-transmitting covering member, and including a side surface of the semiconductor structure layer, a side surface of the light-transmitting substrate, and a side surface of the wavelength conversion layer.

21 Claims, 8 Drawing Sheets

LIGHT-EMITTING ELEMENT AND LIGHT-EMITTING DEVICE

This application claims the priority benefit under 35 U.S.C. § 119 of Japanese Patent Application No. 2018-081721 filed on Apr. 20, 2018, which is hereby incorporated in its entirety by reference.

TECHNICAL FIELD

The presently disclosed subject matter relates to a light-emitting element such as a light-emitting diode (LED) and a light-emitting device using the fight-emitting element.

BACKGROUND ART

There has been known a flip-chip type light-emitting element in which a semiconductor structure layer including a light-emitting layer is stacked on a light-transmitting substrate, and is mounted on a mounting surface by being inverted up and down. In a light-emitting device using such a flip-chip light-emitting element, light emitted from a semiconductor structure layer is extracted through a light-transmitting substrate.

For example, Japanese Patent Application Laid-Open No. 2004-080050 discloses a flip-chip type optical semiconductor element in which positive and negative electrodes are provided on the same plane side of a nitride semiconductor formed on a light-transmitting insulating substrate, and the surface of the nitride semiconductor layer is covered with a protective film except for an exposed portion of the electrode surface.

In the case of a light-emitting device using such a flip-chip type optical semiconductor element as described above, there has been a problem in that, when light is extracted through a light-transmitting substrate, light loss occurs on a side surface of the light-transmitting substrate and luminance is lowered in some cases.

SUMMARY

The presently disclosed subject matter was devised in view of these and other problems and features in association with the conventional art. According to an aspect of the presently disclosed subject matter, a light-emitting element and a light-emitting device having low light loss, high luminance, and high light extraction efficiency can be provided.

According to another aspect of the presently disclosed subject matter, a light-emitting element can include: a semiconductor structure layer having a light-emitting layer; a light-transmitting substrate provided on the semiconductor structure layer; a wavelength conversion layer disposed on the light-transmitting substrate; a light-transmitting covering member configured to cover at least a part of a side surface of the light-transmitting substrate and have transparency to light from the light-emitting layer; and a light-shielding member configured to entirely cover surfaces including a surface of the light-transmitting covering member, and including a side surface of the semiconductor structure layer, a side surface of the light-transmitting substrate, and a side surface of the wavelength conversion layer.

In the light-emitting element according to the foregoing aspect, the side surface of the light-transmitting substrate may have a rough surface region in which conical concavities and convexities on an order of submicron are spread and distributed. In this case, the rough surface region may include a band-like region in which the conical concavities and convexities are densely gathered along a direction parallel to a substrate surface of the light-transmitting substrate.

In the light-emitting element according to the foregoing aspect, the light-shielding member may be configured to entirely cover the surface including the side surface of the semiconductor structure layer, the side surface of the light-transmitting substrate, and the side surface of the wavelength conversion layer; or the light-transmitting covering member may be configured to integrally cover a region from a boundary between the side surface of the wavelength conversion layer and the side surface of the light-transmitting substrate to a lower end of the side surface of the semiconductor structure layer; or the light-transmitting covering member may be configured to cover the side surface of the light-transmitting substrate from a boundary between the side surface of the wavelength conversion layer and the side surface of the light-transmitting substrate to a position not reaching a lower end of the side surface of the light transmitting substrate.

In the light-emitting element according to the foregoing aspect, the light-transmitting covering member may be configured to cover the rough surface region of the side surface of the light-transmitting substrate. Alternatively, the light-transmitting covering member may be configured to cover the band-like region of the side surface of the light-transmitting substrate.

In the light-emitting element according to the foregoing aspect, the light-transmitting covering member may have a refractive index lower than that of the light-transmitting substrate.

In the light-emitting element according to the foregoing aspect, the light-transmitting covering member may include bubbles in concave portions of the conical concavities and convexities of the side surface of the light-transmitting substrate.

In the light-emitting element according to the foregoing aspect, the light-shielding member may contain a light scattering material. Alternatively, the light-shielding member may be a metal film or a member including a metal film.

According to still another aspect of the presently disclosed subject matter, a light-emitting device can include: a mounting surface; and a plurality of the light emitting elements of the forgoing aspects, arranged side by side on the mounting surface.

BRIEF DESCRIPTION OF DRAWINGS

These and other characteristics, features, and advantages of the presently disclosed subject matter will become clear from the following description with reference to the accompanying drawings, wherein.

DESCRIPTION OF EXEMPLARY EMBODIMENTS

Figure 1A:
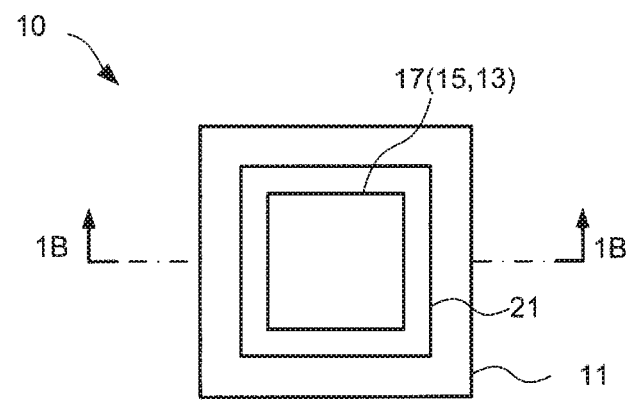
FIG. 1A is a top plan view of a light-emitting device made in accordance with principles of the presently disclosed subject matter as a first exemplary embodiment.

A description will now be made below to light-emitting elements and light-emitting devices of the presently disclosed subject matter with reference to the accompanying drawings in accordance with exemplary embodiments. In the following description and the accompanying drawings, substantially the same or equivalent parts are denoted by the same reference numerals.

First Exemplary Embodiment

Referring to FIGS. 1A to 1F, a configuration of a light-emitting device 10 according to a first exemplary embodiment will be described. FIG. 1A is a top plan view of the light-emitting device 10 made in accordance with the principles of the presently disclosed subject matter as the first exemplary embodiment.

As shown in FIG. 1A, a substrate 11 is a plate-like substrate having a rectangular shape in a top view. The substrate 11 has, on one principal surface, a mounting surface on which electrodes and wirings (not shown) are provided and on which an element such as an LED (Light-Emitting Diode) or the like can be mounted. The substrate 11 may be, for example, a ceramic substrate such as AlN.

A light-emitting element 12 is mounted on the mounting surface of the substrate 11. Hereinafter, the configuration of the light-emitting element 12 will be described.

Figure 1B:
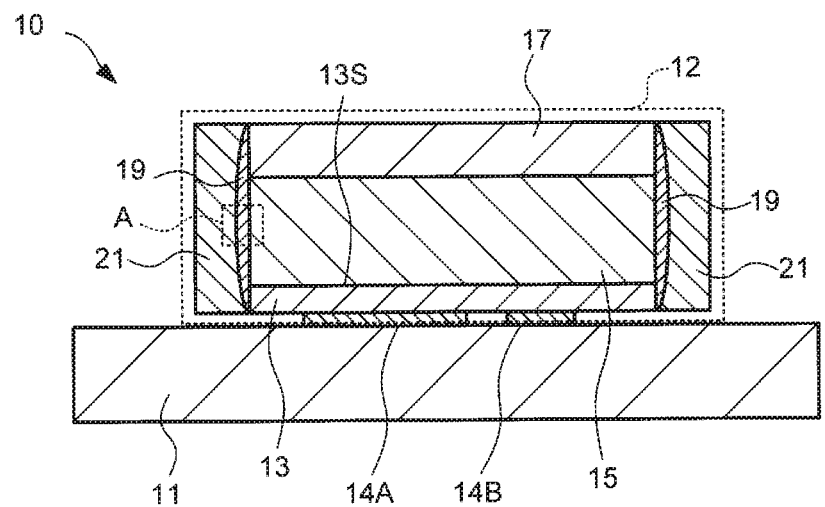
FIG. 1B is a cross-sectional view of the light-emitting device according to the first exemplary embodiment, taken along line 1B-1B of FIG. 1A.

FIG. 1B is a cross-sectional view of the light-emitting device 10 taken along line 1B-1B of FIG. 1A. The light-emitting element 12 has a semiconductor structure layer 13 disposed on the mounting surface of the substrate 11. The semiconductor structure layer 13 has a plurality of semiconductor layers including a light-emitting layer, and is configured to emit light.

The light-emitting element 12 has a p-electrode 14A and an n-electrode 14B provided between the substrate 11 and the semiconductor structure layer 13, so that they are electrically connected to the semiconductor structure layer 13 and the substrate 11.

Figure 1C:
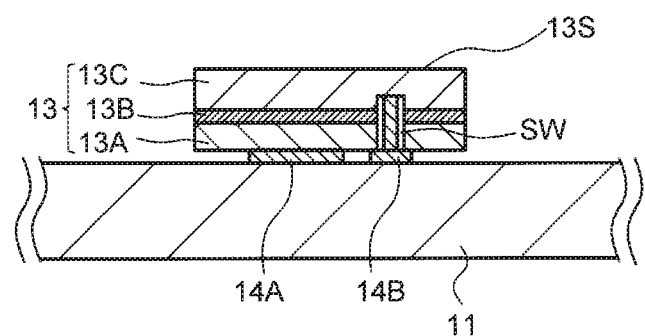
FIG. 1C is a partial enlarged cross-sectional view of the light-emitting device according to the first exemplary embodiment.

FIG. 1C is an enlarged schematic cross-sectional view of the semiconductor structure layer 13, the p-electrode 14A, and the n-electrode 14B of FIG. 1B. Note that a light-transmitting substrate 15 and the like are omitted in this drawing. As shown in FIG. 1C, the semiconductor structure layer 13 is formed by stacking a p-type semiconductor layer 13A, a light-emitting layer 13B, and an n-type semiconductor layer 13C in this order. The semiconductor structure layer 13 has an upper surface that serves as a light exit surface 13S from which light from the light-emitting layer 13B is outputted. The semiconductor structure layer 13 is disposed so that the light-emitting layer 13B is in parallel with the substrate 11.

The p-type semiconductor layer 13A of the semiconductor structure layer 13 is electrically connected to the p-electrode 14A. The n-type semiconductor layer 13C of the semiconductor structure layer 13 is electrically connected to the n-electrode 14B. For example, the n-electrode 14B is connected to the n-type semiconductor layer 13C via a through hole penetrating through the p-type semiconductor layer 13A and the light-emitting layer 13B and having a sidewall SW made of an insulator.

The p-electrode 14A is electrically connected to a p-side wiring (not shown) on the substrate 11 side. The n-electrode 14B is electrically connected to an n-side wiring (not shown) on the substrate 11 side.

Referring back to FIG. 1B, the light-transmitting substrate 15 is disposed on the light exit surface 13S of the semiconductor structure layer 13. The light-transmitting substrate 15 is formed of a sapphire substrate, for example, which is transparent to light emitted from the semiconductor structure layer 13.

The light-emitting element 12 has a wavelength conversion layer 17 disposed on the light-transmitting substrate 15. The wavelength conversion layer 17 is a member containing a wavelength conversion material such as fluorescent material particles, for example. The wavelength conversion layer 17 may be a resin containing a phosphor such as a YAG:Ce phosphor. Alternatively, the wavelength conversion layer 17 may include a glass support and a phosphor thin film. Accordingly, the wavelength conversion layer 17 is configured to convert the wavelength of the light that has been emitted from the semiconductor structure layer 13 and transmitted through the light-transmitting substrate 15.

The light-emitting element 12 has a light-transmitting covering member 19 that is a member configured to entirely cover the surface including the side surface of the semiconductor structure layer 13, the side surface of the light-transmitting substrate 15, and the side surface of the wavelength conversion layer 17. The light-transmitting covering member 19 has transparency to light emitted from the light-emitting layer 13B. In this exemplary embodiment, the light-transmitting covering member 19 has a refractive index lower than that of the light-transmitting substrate 15. For example, a resin such as a silicone resin may be used to form the light-transmitting covering member 19.

The light-emitting element 12 has a light-shielding member 21 configured to cover the side surfaces of the semiconductor structure layer 13, the light-transmitting substrate 15, and the wavelength conversion layer 17 which have been covered with the light-transmitting covering member 19. More specifically, the light-shielding member 21 is formed so as to entirely cover the surfaces including the surface of the light-transmitting covering member 19 and including the side surface of the semiconductor structure layer 13, the side surface of the light-transmitting substrate 15, and the side surface of the wavelength conversion layer 17.

The light-shielding member 21 is configured to shield light, and is formed of, for example, a resin containing a material that reflects light. For example, the light-shielding member 21 is formed of a material called a white resin in which a light scattering material is dispersed in a resin material such as a silicone resin.

Figure 1D:
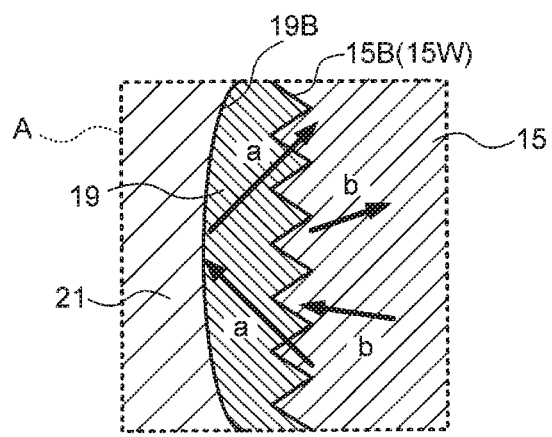
FIG. 1D is a partial enlarged cross-sectional view of the light-emitting device according to the first exemplary embodiment.

FIG. 1D is an enlarged view of a part A surrounded by a broken line in FIG. 1B. FIG. 1D schematically shows an interface 15B between the light-transmitting substrate 15 and the light-transmitting covering member 19, and an interface 19B between the light-transmitting covering member 19 and the light-shielding member 21. Arrows in FIG. 1D schematically represent the traveling directions of the light emitted from the light-emitting layer 13B and guided into the light-transmitting substrate 15.

As shown in FIG. 1D, the interface 15B has concavities and convexities. This is because the side surface 15W of the light-transmitting substrate 15 has unevenness. More specifically, the side surface 15W of the light-transmitting substrate 15 has roughness of about several tens nm to several microns. In particular, the side surface 15W has a region in which conical (or pyramidal) concavities and convexities (hereinafter, also referred to simply as conical concavities and convexities) of 100 nm to several hundreds nm (submicron order) are distributed.

In this exemplary embodiment, as shown in FIG. 1D, light having been transmitted through the light-transmitting substrate 15 and further through the light-transmitting covering member 19 can be reflected by the interface 19B between the light-transmitting covering member 19 and the light-shielding member 21. Then, the light reflected by the interface 19B passes through the interface 15B and returns to the light-transmitting substrate 15 (arrows 'a' in FIG. 1D).

In this exemplary embodiment, the light-transmitting covering member 19 has the refractive index lower than that of the light-transmitting substrate 15. Thus, the light that has entered the interface 15B at an angle equal to or greater than the critical angle can be totally reflected by the interface 15B, and return to the light-transmitting substrate 15 side with almost no attenuation (arrows 'b' in FIG. 1D).

If the light-transmitting covering member 19 is not provided, light directed from the light-transmitting substrate 15 to the side surface 15W is reflected by the interfaces at the light-transmitting substrate 15 and the light-shielding member 21 to cause multiple reflection, and is absorbed to become a light loss.

Therefore, in the present exemplary embodiment, multiple reflection at the interfaces can be prevented, and light from the light-transmitting substrate 15 toward the interface 15B can return to the light-transmitting substrate 15 side without being absorbed. That is, it is possible to suppress a decrease in luminance due to light loss.

Further, selection of a material so that the refractive index difference between the light-transmitting substrate 15 and the light-transmitting covering member 19 becomes larger may cause light incident on the interface 15B from the light-transmitting substrate 15 to be easily totally reflected by the interface 15B. Thus, the light can be returned to the light-transmitting substrate 15 side more efficiently.

Figure 1E:
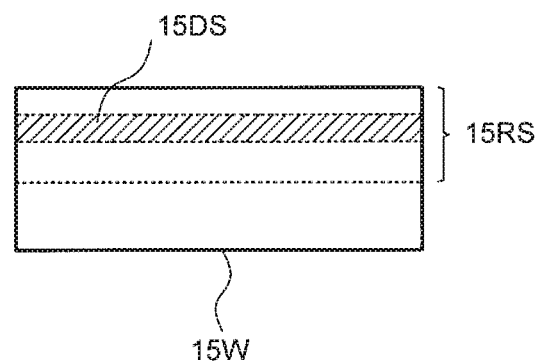
FIG. 1E is a partial enlarged view of the light-emitting device according to the first exemplary embodiment.

FIG. 1E is a schematic view illustrating an example of distribution of conical concavities and convexities on the side surface 15W of the light-transmitting substrate 15. For the sake of explanation, a portion of the side surface 15W is hatched.

The long side of the rectangular side surface 15W illustrated in FIG. 1E is a side parallel to the substrate surface of the light-transmitting substrate 15. A region 15RS in FIG. 1E indicates a rough surface region in which conical concavities and convexities on the order of submicron are spread and distributed, and thus the surface roughness is large. The rough surface region 15RS includes a band-like region 15DS in which conical concavities and convexities are densely gathered along a direction parallel to the substrate surface of the light-transmitting substrate 15.

These submicron-order conical concavities and convexities and their characteristic distribution are formed. Specifically, the conical concavities and convexities are formed on the cut surface cut by Stealth Dicing (trademark by Hamamatsu Photonics K. K.), which is a dicing technique for cutting a substrate by a laser.

In the present exemplary embodiment, since the light-transmitting covering member 19 is provided, even if the conical concavities and convexities exist on the side surface of the light-transmitting substrate 15, the multiple reflection as described above and the loss of light associated therewith do not occur. Even if the belt-shaped region 15DS in which the conical concavities and convexities are densely arranged exists, it is possible to suppress a decrease in luminance due to light loss.

Figure 1F:
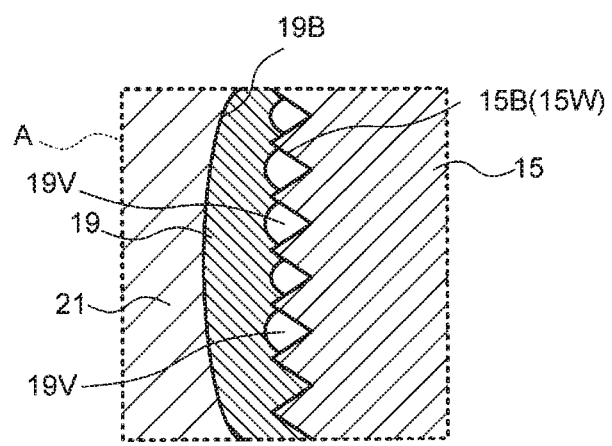
FIG. 1F is a partial enlarged cross-sectional view of the light-emitting device according to the first exemplary embodiment.

FIG. 1F is an enlarged view of a part A surrounded by a broken line in FIG. 1B similarly to FIG. 1D. In the present exemplary embodiment, FIG. 1F shows an example in which the light-transmitting covering member 19 includes bubbles 19V in the concave portions of the conical concavities and convexities. A part of the interface 15B between the light-transmitting substrate 15 and the light-transmitting covering member 19 is in contact with the bubbles 19V. That is, a portion of the interface 15B is the interface between the light-transmitting substrate 15 and the bubbles 19V.

Usually, the refractive index of the light-transmitting covering member 19 is larger than one (1) which is the refractive index of air. Therefore, the difference in refractive index between the light-transmitting substrate 15 and the bubble 19V is larger than the difference in refractive index between the light-transmitting substrate 15 and the light-transmitting covering member 19. Accordingly, at the interface between the light-transmitting substrate 15 and the bubble 19V, light traveling from the light-transmitting substrate 15 to the interface becomes more susceptible to total reflection.

For example, when the light-transmitting substrate 15 is a sapphire substrate, its refractive index is about 1.75, and when the light-transmitting covering member 19 is a silicone resin, its refractive index is about 1.45. Therefore, the refractive index difference between the light-transmitting substrate 15 and the light-transmitting covering member 19 is about 0.30. In this case, the refractive index difference between the light-transmitting substrate 15 and the bubble 19V is about 0.75, which is larger than 0.30 of the refractive index difference between the light-transmitting substrate 15 and the light-transmitting covering member 19.

The light-transmitting covering member 19 including the bubbles 19V can be formed, for example, by mixing the bubble into a resin material to be the light-transmitting covering member 19 or by not performing a defoaming step which is usually performed after the application, when the resin material is applied to the side surface 15W of the light-transmitting substrate 15 at the time of producing the light-emitting element 12. In addition, for example, the bubbles 19V can be held in the light-transmitting covering member 19 by selecting a resin material having a viscosity suitable for mixing bubbles or selecting a resin that is cured at a lower temperature when a thereto-curable resin is adopted.

In this exemplary embodiment, a silicone resin is exemplified as a resin that can be used for the light-transmitting covering member 19, but various materials such as an epoxy resin, an acrylic resin, and the like may be used.

In addition, although an example in which the fight-shielding member 21 includes a light scattering material has been described, the light-shielding member 21 may be configured to include a light absorbing material such as carbon black in addition to this.

The light-emitting device 10 may include a plurality of light-emitting elements 12, and the plurality of fight-emitting elements 12 may be arranged side by side on the mounting surface of the substrate 11.

As described above in detail, the light-emitting element 12 of the present exemplary embodiment has the light-transmitting covering member 19 configured to entirely cover the surface including the side surface of the semiconductor structure layer 13, the side surface of the light-transmitting substrate 15, and the side surface of the wavelength conversion layer 17. The side surface 15W of the light-transmitting substrate 15 has conical concavities and convexities on the order of submicron.

The side surface 15W of the light-transmitting substrate 15 is covered with the light-transmitting covering member 19 that has a refractive index lower than that of the light-trans thing substrate 15. Light that has passed through the light-transmitting covering member 19 from the light-transmitting substrate 15 is reflected by the interface 19B with the light-shielding member 21, and light that has entered the interface 15B from the light-transmitting substrate 15 at an angle equal to or greater than the critical angle is totally reflected by the interface 15B with the light-transmitting covering member 19, and both are returned to the light-transmitting substrate 15 side. That is, the light from the light-transmitting substrate 15 toward the interface 15B is returned to the light-transmitting substrate 15 side without being absorbed by the interface 15B.

Therefore, according to the present exemplary embodiment, it is possible to provide a light-emitting element and a light-emitting device with low light loss, high luminance, and high light extraction efficiency.

Second Exemplary Embodiment

Figure 2:
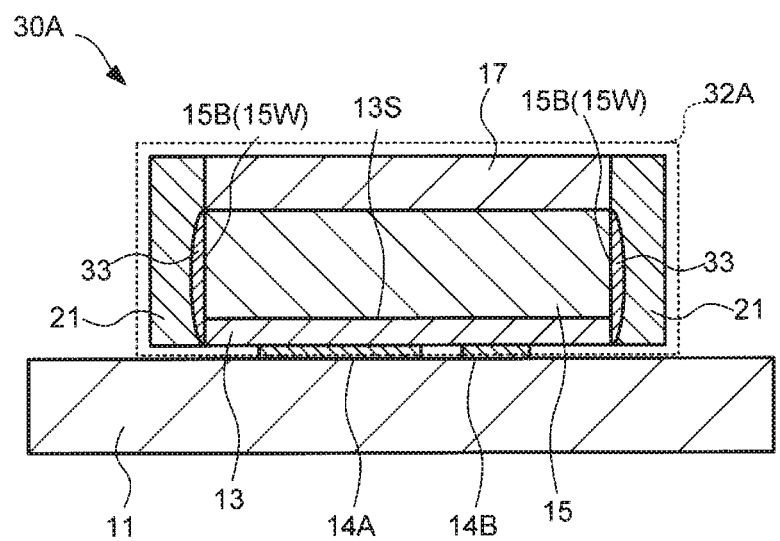
FIG. 2 is a cross-sectional view of a light-emitting device according to a second exemplary embodiment.

FIG. 2 is a cross-sectional view illustrating a cross section of a light-emitting device 30A according to the second exemplary embodiment. The light-emitting device 30A includes a light-emitting element 32A. The light-emitting device 30A is different from the light-emitting device 10 of the first exemplary embodiment in that the light-emitting element 32A has a light-transmitting covering member 33 instead of the light-transmitting covering member 19, and is configured in the same manner in the other points.

The light-transmitting covering member 33 is formed so as to entirely and integrally cover the side surface of the semiconductor structure layer 13 and the side surface of the light-transmitting substrate 15 without covering the side surface of the wavelength conversion layer 17. In other words, the light-transmitting covering member 33 integrally covers the region from the boundary between the side surface of the wavelength conversion layer 17 and the side surface of the light-transmitting substrate 15 to the lower end of the side surface of the semiconductor structure layer 13. As the light-transmitting covering member 33, similarly to the light-transmitting covering member 19, a resin such as a silicone resin can be used.

In the light-emitting device 30A, light emitted from the light-emitting layer 13B and directed toward the side surface 15W of the light-transmitting substrate 15 is reflected by the interface 15S between the light-transmitting substrate 15 and the light-transmitting covering member 33 or by the interface between the light-transmitting covering member 33 and the light-shielding member 21 and returned to the light-transmitting substrate 15, as in the case of the first exemplary embodiment. The returned light is guided through the light-transmitting substrate 15 and enters the wavelength conversion layer 17, and is wavelength-converted and outputted from the upper surface of the wavelength conversion layer 17.

The light-transmitting covering member 33 is provided so as not to cover the wavelength conversion layer 17. That is, the light-shielding member 21 is in direct contact with the side surface of the wavelength conversion layer 17. Therefore, the light guided in the light-transmitting covering member 33 does not exit from the light-emitting element 32A without passing through the wavelength conversion layer 17. Therefore, it is possible to prevent light that has not been subjected to wavelength conversion from being outputted from the vicinity of the outer periphery of the wavelength conversion layer 17, and to suppress color unevenness of light emitted from the light-emitting element 32A.

Therefore, in the present exemplary embodiment, since the side surface 15W of the light-transmitting substrate 15 is covered with the light-transmitting covering member 33, it is possible to suppress color unevenness while preventing light loss on the side surface 15W of the light-transmitting substrate 15.

Therefore, according to this exemplary embodiment, it is possible to provide a light-emitting element and a light-emitting device in which light loss is small, light of high luminance is obtained in a highly efficient manner, and color unevenness is small.

In this exemplary embodiment, a case where the light-transmitting covering member 33 does not cover the side surface of the wavelength conversion layer 17 has been described, but the light-transmitting covering member 33 may cover part of the side surface of the wavelength conversion layer 17 in the vicinity of the boundary between the side surface of the wavelength conversion layer 17 and the side surface of the light-transmitting substrate 15. In this case, the light-transmitting covering member 33 should not reach the upper surface of the wavelength conversion layer 17.

Third Exemplary Embodiment

Figure 3:
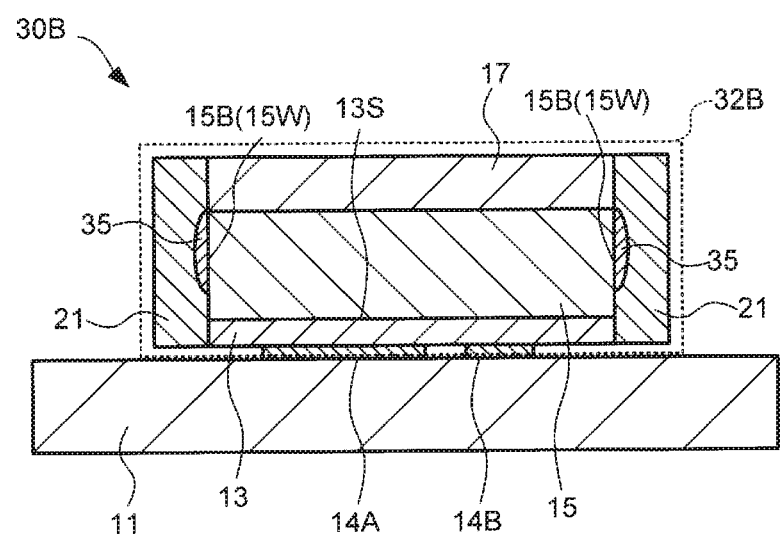
FIG. 3 is a cross-sectional view of a light-emitting device according to a third exemplary embodiment.

FIG. 3 is a cross-sectional view showing a cross section of a light-emitting device 30B according to a third exemplary embodiment. The light-emitting device 30B includes a light-emitting element 32B. The light-emitting device 30B is different from the light-emitting device 10 of the first exemplary embodiment in that the light-emitting element 32B has a light-transmitting covering member 35 instead of the light-transmitting covering member 19, and is configured in the same manner in the other points.

The light-transmitting covering member 35 covers the side surface of the light-transmitting substrate 15 without covering the side surfaces of the wavelength conversion layer 17 and the semiconductor structure layer 13. More specifically, the light-transmitting covering member 35 covers the side surface of the light-transmitting substrate 15 from the boundary between the side surface of the wavelength conversion layer 17 and the side surface of the light-transmitting substrate 15 to a position not reaching the lower end of the side surface of the light-transmitting substrate 15. As the material for the light-transmitting covering member 35, similarly to the light-transmitting covering member 19, a resin such as a silicone resin can be used.

In the present exemplary embodiment, the light-transmitting covering member 35 covers the rough surface area 15RS in which the conical concavities and convexities are distributed in a belt shape and the surface roughness is large, among the side surfaces of the light-transmitting substrate 15, as shown in FIG. 1E. Therefore, the light-transmitting covering member 35 covers the band-shaped region 15DS (see FIG. 1E) which is included in the rough surface region 15RS and in which the conical concavities and convexities are densely gathered.

In the light-emitting device 30B, light emitted from the light-emitting layer 13B and directed toward the boundary between the side surface of the light-transmitting substrate 15 and the light-transmitting covering member 35 is reflected by the interface 15B between the light-transmitting substrate 15 and the light-transmitting covering member 35 or by the interface between the light-transmitting covering member 35 and the light-shielding member 21 and returned to the light-transmitting substrate 15, as in the case of the first exemplary embodiment.

The returned light is guided through the light-transmitting substrate 15 and enters the wavelength conversion layer 17, and is wavelength-converted to be outputted from the upper surface of the wavelength conversion layer 17. Therefore, the formation of the light-transmitting covering member 35 can suppress the loss of light caused by the conical concavities and convexities distributed in the rough surface region 15RS.

In this exemplary embodiment, the side surface of the semiconductor structure layer 13 is not covered with the light-transmitting covering member 35, but is covered with the light-shielding member 21. As a result, the thickness of the light-shielding member 21 on the side surface of the semiconductor structure layer 13 can be sufficiently ensured. The light emitted from the light-emitting layer 13B of the semiconductor structure layer 13 is reflected by the light scattering material contained in the light-shielding member 21, and thus light leakage from the side surface of the semiconductor structure layer 13 is suppressed.

Further, similarly to the case of the second exemplary embodiment, since the light-transmitting covering member 35 does not cover the side surface of the wavelength conversion layer 17, the light guided in the light-transmitting covering member 35 is not outputted from the light-emitting element 32B without passing through the wavelength conversion layer 17. Therefore, it is possible to prevent light that has not been subjected to wavelength conversion from being outputted from the vicinity of the outer periphery of the wavelength conversion layer 17, and to suppress color unevenness of light outputted from the light-emitting element 32B.

Therefore, according to the present exemplary embodiment is possible to suppress the light leakage from the side surface of the semiconductor structure layer 13 and the occurrence of the color unevenness in the vicinity of the outer periphery of the wavelength conversion layer 17 while preventing the loss of light caused by the conical concavities and convexities existing in a large amount in the rough surface region of the side surface of the light-transmitting substrate 15. Therefore, it is possible to provide a light-emitting element and a light-emitting device in which light loss is small, light of high luminance is obtained in a highly efficient manner, and color unevenness is small.

In the present exemplary embodiment, the case where the light-transmitting covering member 35 does not cover the side surface of the wavelength conversion layer 17 has been described, but the light-transmitting covering member 35 may cover the side surface of the wavelength conversion layer 17 in the vicinity of the boundary between the side surface of the wavelength conversion layer 17 and the side surface of the light-transmitting substrate 15. In this case, the light-transmitting covering member 35 does not need to reach the upper surface of the wavelength conversion layer 17.

Fourth Exemplary Embodiment

Figure 4A:
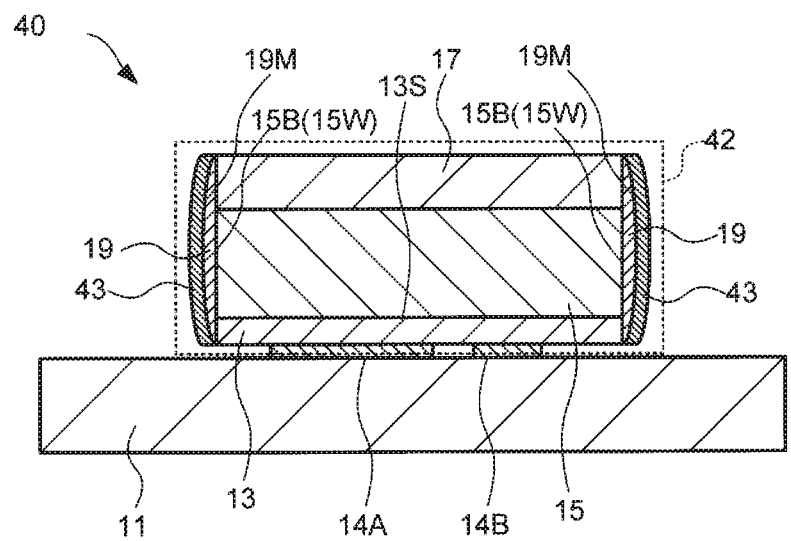
FIG. 4A is a cross-sectional view of a light-emitting device according to a fourth exemplary embodiment.

FIG. 4A is a cross-sectional view showing a cross section of a light-emitting device 40 according to a fourth exemplary embodiment. The light-emitting device 40 includes a light-emitting element 42. The light-emitting device 40 is different from the light-emitting device 10 of the first exemplary embodiment in that the light-emitting element 42 has a reflective film 43 as a light-shielding member instead of the light-shielding member 21, and is configured in the same manner in the other points.

The reflective film 43 is formed so as to cover the light-transmitting covering member 19. The reflective film 43 is a metal film made of, for example, a metal such as Pt, Ag, or Al. The reflective film 43 reflects the light incident on the light-transmitting covering member 19.

In the light-emitting device 40, as in the case of the first exemplary embodiment, light that has entered from the light-transmitting substrate 15 to the interface 15B at an angle equal to or greater than the critical angle is totally reflected by the interface 15B, and returns to the light-transmitting substrate 15 side with almost no attenuation.

On the other hand, the light transmitted through the light-transmitting covering member 19 from the light-transmitting substrate 15 is reflected by the interface 19M between the light-transmitting covering member 19 and the reflective film 43, and returns to the light-transmitting substrate 15 side through the interface 15B.

Therefore, according to the present exemplary embodiment, even if the conical concavities and convexities exist on the side surface of the light-transmitting substrate 15, the light from the light-transmitting substrate 15 toward the interface 15B returns to the light-transmitting substrate 15 side without being absorbed, and it is possible to suppress the decrease in luminance due to the light loss.

In the present exemplary embodiment, the thickness of the reflective film 43 in the direction parallel to the substrate 11 can be reduced as compared with that of the light-shielding member 21. Therefore, the size of the light-emitting element 42 can be reduced, and the package size at the time of mounting the light-emitting element 42 can be reduced.

Modified Example

Figure 4B:
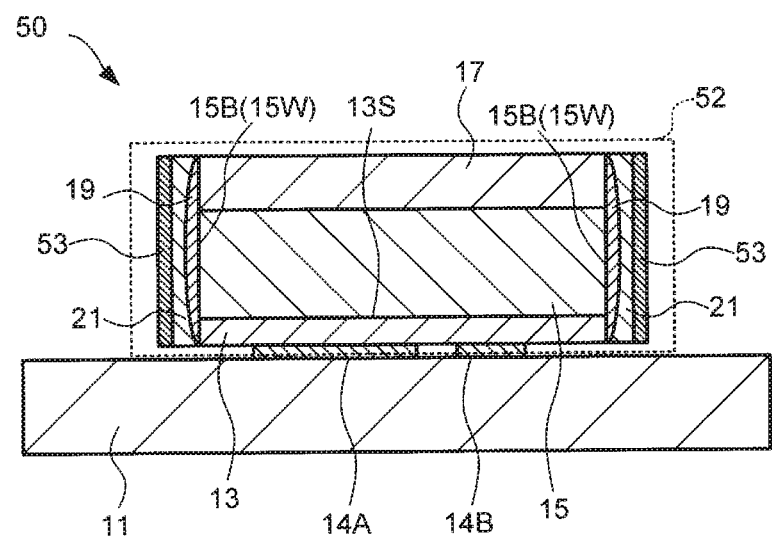
FIG. 4B is a cross-sectional view of a light-emitting device according to a modified example of the fourth exemplary embodiment.

FIG. 4B is a cross-sectional view showing a cross section of a light-emitting device 50 which is a modified example of the fourth exemplary embodiment. The light-emitting device 50 includes a light-emitting element 52. The light-emitting device 50 is different from the light-emitting device 40 of the fourth exemplary embodiment in that the light-emitting dement 52 includes the light-shielding member 21 and the reflective film 53 as members including a metal film instead of the reflective film 43, and is configured in the same manner in the remaining points.

The light-shielding member 21 is formed so as to cover the surface of the light-transmitting covering member 19 that covers the side surfaces of the semiconductor structure layer 13, the light-transmitting substrate 15, and the wavelength conversion layer 17, as in the case of the first exemplary embodiment.

The reflective film 53 is formed so as to cover the light-shielding member 21. The provision of both the light-shielding member 21 and the reflective film 53 in this manner can reliably suppress light leakage from the side surfaces of the semiconductor structure layer 13, the light-transmitting substrate 15, and the wavelength conversion layer 17.

Figure 5A:
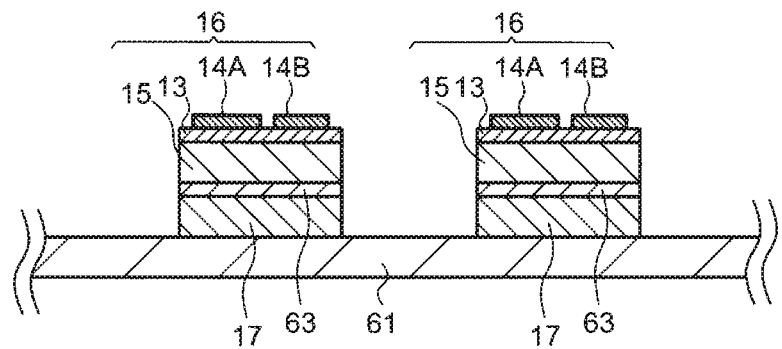
FIG. 5A is a cross-sectional view illustrating one example of a production process of a light-emitting element made in accordance with the principles of the presently disclosed subject matter.

Referring to FIGS. 5A to 5E, as an example of the production process of the Light-emitting element, an example of the production process of the light-emitting element 52 will be described. FIG. 5A is a cross-sectional view illustrating a wavelength conversion layer 17 disposed on a UV sheet 61 and an LED chip 16 disposed on the wavelength conversion layer 17. In the process shown in FIG. 5A, the LED chip 16, which includes the semiconductor-structure layer 13, the p-electrode 14A, the n-electrode 14B, and the light-transmitting substrate 15, is bonded to the wavelength-conversion layer 17 with an adhesive 63.

Figure 5B:
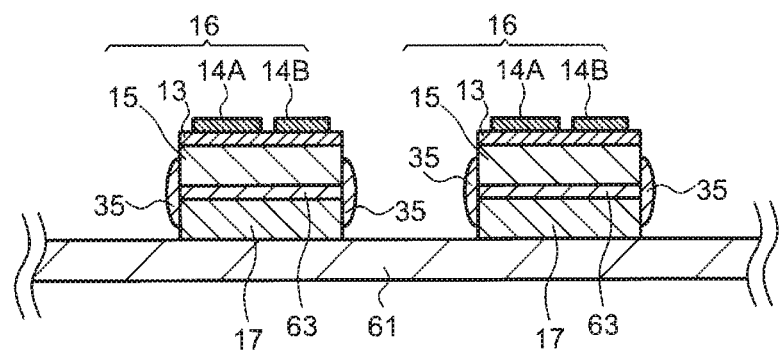
FIG. 5B is a cross-sectional view illustrating the example of the production process of the light-emitting element.

FIG. 5B is a cross-sectional view showing the light-transmitting covering member 35 formed after the process of FIG. 5A. In the process shown in the 5B, a resin material serving as a raw material of the light-transmitting covering member 35 is applied to the side surfaces of the light-transmitting substrates 15 and the side surfaces of the wavelength-converting layers 17. In FIG. 5B, the resin material is applied so as to cover a region not including the upper end portion of the side surface of the light-transmitting substrate 15 and a region not including the lower end portion of the wavelength-conversion layer 17. That is, the light-transmitting covering member 35 as shown in FIG. 3 is formed.

The thickness and the shape of the light-transmitting covering member 35 may be adjusted by appropriately selecting the resin material to be applied in the process of FIG. 5B in accordance with the properties such as viscosities and the like. For example, selection of a resin material having a higher viscosity can achieve the formation of the light-transmitting covering member 35 having a large thickness and a rounded shape. Further, for example, selection of a resin material having a lower viscosity can achieve the formation of the light-transmitting covering member 35 having a thin and flat shape.

The light-transmitting covering member 35 may be formed by extruding the adhesive 63 in the process of FIG. 5A and spreading it to the side surfaces of the light-transmitting substrate 15 and the side surfaces of the wavelength conversion layer 17. For example, in the process shown in FIG. 5A, an appropriate amount of a silicone-based adhesive is applied to the upper surface of the semiconductor structure layer 13 as the adhesive 63, and the silicone-based adhesive is pushed out by the lower surface of the wavelength conversion layer 17, so that the silicone-based adhesive spreads to the side surfaces of the light-transmitting substrate 15 and the side surfaces of the wavelength conversion layer 17 by the surface tension, thereby forming the light-transmitting covering member 35.

Figure 5C:
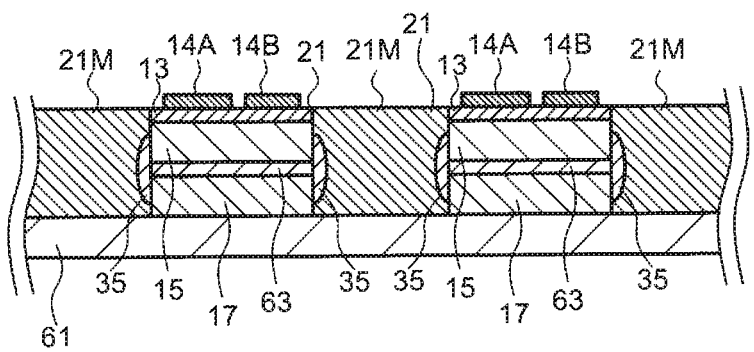
FIG. 5C is a cross-sectional view illustrating the example of the production process of the light-emitting element.

FIG. 5C is a cross-sectional view illustrating a resin material 21M that forms a light-shielding member 21 filled in on a UV sheet 61 after the process of FIG. 5B. As shown in FIG. 5C, the resin material 21M is filled in between elements having the wavelength conversion layer 17, the LED chip 16, and the light-transmitting covering member 35 disposed on the UV sheet 61. For example, the resin material 21M is poured into between the elements and then cured by heating or the like.

Figure 5D:
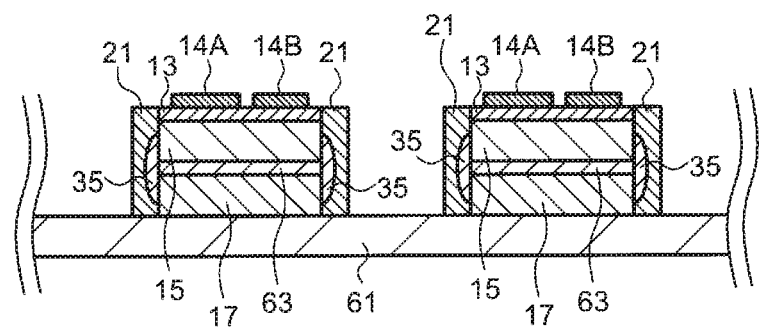
FIG. 5D is a cross-sectional view illustrating the example of the production process of the light-emitting element.
Figure 5E:
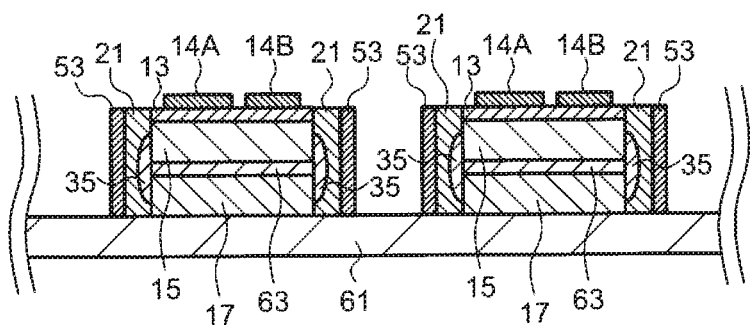
FIG. 5E is a cross-sectional view illustrating the example of the production process of the light-emitting element.

FIG. 5D is a cross-sectional view showing the light-shielding member 21 formed by cutting the resin material 21M between the elements. FIG. 5E is a cross-sectional view showing the reflective film 53 formed on the side surface of the light-shielding member 21. For example, in the process of FIG. 5E, a thin film of a metal such as Pt is formed by an evaporation method or a sputtering method.

For example, in the process shown in FIG. 5E, a portion where the reflective film 53 is not to be formed is protected by a mask such as a UV-sheet, so that the reflective film 53 is selectively formed only on the side surface of the light-shielding member 21. In this manner, the light-emitting element 52 having the light-transmitting covering member 35, the light-shielding member 21, and the reflective film 53 can be produced.

Figure 6:
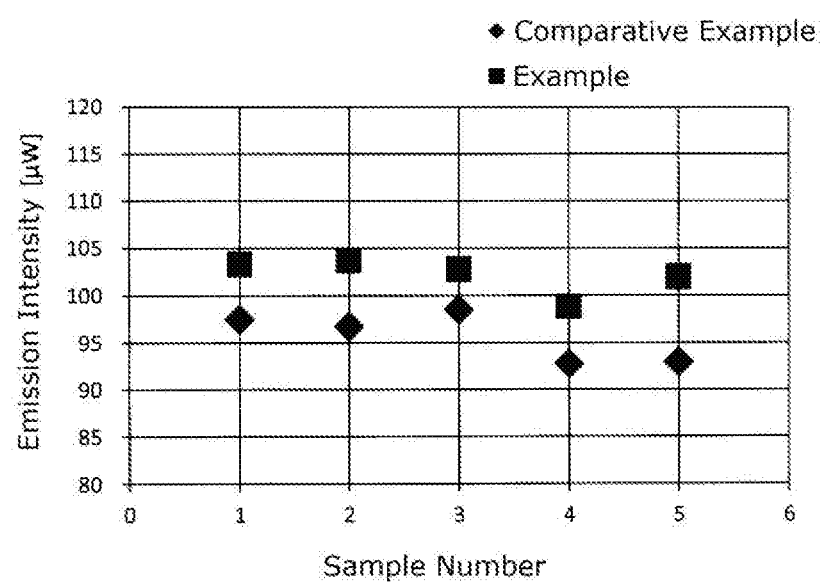
FIG. 6 is a graph showing results of measuring the emission intensities of the light-emitting element according to the example of the presently disclosed subject matter and that of the comparative example.

FIG. 6 is a graph showing the results of measuring light emission intensities of the light-emitting device 40 having the light-emitting element 42 according to the fourth exemplary embodiment. In the graph of FIG. 6, the light emission intensities of the light-emitting device 40 are shown as "Example". In the graph of FIG. 6, as a comparative example, light emission intensities of a light-emitting device configured in the same manner as the light-emitting device 40 except that the light-transmitting covering member 19 is not provided is shown as a "comparative example".

Therefore, in the light-emitting device of the comparative example, the reflective film 43 is formed on the side surface of the semiconductor structure layer 13, the side surface of the light-transmitting substrate 15, and the side surface of the wavelength conversion layer 17. In both the comparative example and the example, a Pt film was formed as the reflective film 43.

As shown in FIG. 6, the light emission intensities of five samples were measured for each of the examples and the comparative examples. In the graph of FIG. 6, the horizontal axis represents the sample number, and the vertical axis represents the light emission intensity [μW]. The average value of the light emission intensities of the five samples was 95.7 μW in the comparative example while being 102.1 μW in the example, and the result was about 6.7% higher in the example than in the comparative example.

It can be said that the provision of the light-transmitting covering member 19 between the side surface of the light-transmitting substrate 15 and the reflective film 43 could reduce the loss of light on the side surface of the light-transmitting substrate 15.

It should be noted that the configurations shown in the above-described exemplary embodiments and modified examples are merely illustrative, and can be selected, combined, and changed according to use applications and the like. In the light-emitting device of the present invention, a plurality of light-emitting elements according to the presently disclosed subject matter may be arranged side by side on a mounting surface.

As described above, according to the light-emitting element and the light-emitting device according to the presently disclosed subject matter, the provision of the light-transmitting covering member, which covers at least a part of the side surface of the light-transmitting substrate, can suppress light loss due to light absorption in the side surface of the light-transmitting substrate. In particular, when a rough surface region in which a large number of conical concavities and convexities are present exists on the side surface of the light-transmitting substrate, light absorption in the rough surface region is greatly reduced by the light-transmitting covering member. Therefore, a light-emitting element and a light-emitting device with high luminance and high efficiency can be provided.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A light-emitting element comprising:
   a semiconductor structure layer having a light-emitting layer;
   a light-transmitting substrate provided on the semiconductor structure layer;
   a wavelength conversion layer disposed on the light-transmitting substrate;
   a light-transmitting covering member which covers at least a part of a side surface of the light-transmitting substrate, and a side surface of the wavelength conversion layer, and which has transparency to light from the light-emitting layer; and
   a light-shielding member which entirely covers a surface of the light-transmitting covering member, a side surface of the semiconductor structure layer, the side surface of the light-transmitting substrate, and the side surface of the wavelength conversion layer,
   wherein the light-transmitting covering member has a refractive index lower than a refractive index of the light-transmitting substrate.

2. The light-emitting element according to claim 1, wherein the side surface of the light-transmitting substrate has a rough surface region in which conical concavities and convexities on an order of submicron are spread and distributed, and
   wherein the light-transmitting covering member covers the rough surface region of the side surface of the light-transmitting substrate.

3. The light-emitting element according to claim 2, wherein the rough surface region includes a band-like region in which the conical concavities and convexities are densely gathered along a direction parallel to a substrate surface of the light-transmitting substrate, and
   wherein the light-transmitting covering member covers the band-like region of the side surface of the light-transmitting substrate.

4. The light-emitting element according to claim 1, wherein the light-transmitting covering member entirely covers the side surface of the semiconductor structure layer, the side surface of the light-transmitting substrate, and the side surface of the wavelength conversion layer.

5. The light-emitting element according to claim 2, wherein bubbles are provided in concave portions of the conical concavities and convexities of the side surface of the light-transmitting substrate.

6. The light-emitting element according to claim 1, wherein the light-shielding member is formed of a resin material which contains a light scattering material dispersed therein.

7. The light-emitting element according to claim 1, wherein the light-shielding member comprises a reflective film.

8. The light-emitting element according to claim 7, wherein the reflective film is a metal film.

9. A light-emitting device comprising:
   a mounting surface; and
   a plurality of the light emitting elements according to claim 1, arranged side by side on the mounting surface.

10. The light-emitting element according to claim 3, wherein the light-transmitting covering member covers the rough surface region of the side surface of the light-transmitting substrate.

11. The light-emitting element according to claim 1, wherein the light-transmitting covering member is made of a resin material and has an upper end and a lower end and a protruding shape rounded from the upper end to the lower end.

12. The light-emitting element according to claim 1, wherein the wavelength conversion layer is disposed on the light-transmitting substrate via an adhesive, and the light-transmitting covering member is formed by spreading the adhesive to the side surface of the light-transmitting substrate and the side surface of the wavelength conversion layer.

13. The light-emitting element according to claim 1, wherein the light-shielding member is covered by a reflective film.

14. The light-emitting element according to claim 1, wherein a refractive index difference between the light-transmitting substrate and the light-transmitting covering member is greater than or equal to 0.3.

15. The light-emitting element according to claim 1, wherein the light-shielding member includes a light scattering material.

16. A light-emitting device comprising:
   a flip-chip type optical semiconductor light-emitting element comprising:
      a rectangular sapphire substrate;
      a semiconductor structure layer comprising a p-type semiconductor layer, a light-emitting layer, and an n-type semiconductor layer, the semiconductor structure layer being disposed on a surface of the sapphire substrate; and
      a p-electrode and an n-electrode disposed on the semiconductor structure layer;
   a substrate having a principal surface on which an electrode and a wiring are provided and on which the flip-chip type optical semiconductor light-emitting element is mounted;
   a wavelength conversion layer disposed on the sapphire substrate;
   a light-shielding member which covers a side surface of the sapphire substrate and a side surface of the wavelength conversion layer; and
   a light-transmitting covering member,
   wherein:
   the flip-chip type optical semiconductor light-emitting element is mounted on the principal surface so that the sapphire substrate is positioned on an upper side,
   at least one side surface of the rectangular sapphire substrate entirely has a rough surface region in which conical concavities and convexities on an order of submicron are spread and distributed, the light-transmitting covering member covers the rough surface region and is in direct contact with the light-shielding member, the light-transmitting covering member being provided between the side surface of the sapphire substrate having the rough surface region and the light-shielding member, and the light-transmitting covering member has a refractive index lower than a refractive index of the sapphire substrate.

17. The light-emitting device according to claim 16, wherein the light-shielding member has an inner side surface that is in direct contact with the light-transmitting covering member and recessed outward.

18. The light-emitting device according to claim 17, wherein the light-shielding member has an outer side surface that is parallel with the side surface of the light-transmitting substrate and extends in a direction perpendicular to the light-transmitting substrate.

19. The light-emitting device according to claim 16, wherein the rough surface region includes a band-like region in which the conical concavities and convexities are densely gathered along a direction parallel to a substrate surface of the light-transmitting substrate.

20. The light-emitting device according to claim 16, wherein bubbles are provided in concave portions of the conical concavities and convexities of the side surface of the light-transmitting substrate.

21. A light-emitting element comprising:

a semiconductor structure layer having a light-emitting layer;

a light-transmitting substrate provided on the semiconductor structure layer;

a wavelength conversion layer disposed on the light-transmitting substrate via an adhesive;

a light-transmitting covering member which covers at least a part of a side surface of the light-transmitting substrate, and a side surface of the wavelength conversion layer and have transparency to light from the light-emitting layer; and a light-shielding member which entirely covers a surface of the light-transmitting covering member, a side surface of the semiconductor structure layer, a side surface of the light-transmitting substrate, and a side surface of the wavelength conversion layer, wherein:

the light-transmitting covering member is formed of a same material as the adhesive to be continuous with the adhesive, and the light-transmitting covering member is made of a resin material having a refractive index lower than a refractive index of the light-transmitting substrate, has an upper end and a lower end, and has an outward protruding shape rounded from the upper end to the lower end.

* * * * *